(12) United States Patent
Yen et al.

(10) Patent No.: US 7,459,943 B2
(45) Date of Patent: Dec. 2, 2008

(54) HIGH ACCURACY SAMPLE AND HOLD CIRCUIT HAVING A COMMON NEGATIVE INPUT TERMINAL

(75) Inventors: Chih-Jen Yen, Hsinchu (TW); Chih-Yuan Hsieh, Chiayi (TW)

(73) Assignee: Novatek Microelectronics Corp., Hsinchu (TW)

( * ) Notice: Subject to any disclaimer, the term of this patent is extended or adjusted under 35 U.S.C. 154(b) by 48 days.

(21) Appl. No.: 11/609,337

(22) Filed: Dec. 12, 2006

(65) Prior Publication Data
US 2008/0042695 A1 Feb. 21, 2008

(30) Foreign Application Priority Data
Jul. 3, 2006 (TW) .............................. 95124105 A

(51) Int. Cl.
G11C 27/02 (2006.01)
(52) U.S. Cl. .............................. 327/91; 327/94; 327/95
(58) Field of Classification Search ................... 327/91, 327/94, 95
See application file for complete search history.

(56) References Cited

U.S. PATENT DOCUMENTS

| | | | |
|---|---|---|---|
| 5,180,932 A * | 1/1993 | Bengel ........................ 327/362 |
| 5,296,751 A * | 3/1994 | Sano ............................ 327/94 |
| 5,304,866 A * | 4/1994 | Uranaka ....................... 327/63 |
| 5,317,203 A * | 5/1994 | Tanaka et al. ................. 327/94 |
| 5,831,480 A * | 11/1998 | Kato et al. ................... 330/253 |
| 5,959,470 A * | 9/1999 | Sugihashi .................... 327/94 |
| 6,005,440 A * | 12/1999 | Okamoto .................... 330/253 |
| 6,507,245 B2 * | 1/2003 | Tai ............................. 330/255 |
| 6,614,302 B2 * | 9/2003 | Abe ............................ 330/253 |
| 6,628,148 B2 * | 9/2003 | Shirasaki ..................... 327/95 |
| 6,777,984 B2 * | 8/2004 | Hangaishi .................... 327/66 |
| 6,933,781 B2 * | 8/2005 | Jaussi et al. ................. 330/253 |

* cited by examiner

Primary Examiner—Kenneth B. Wells
(74) Attorney, Agent, or Firm—Jianq Chyun IP Office

(57) ABSTRACT

A high accuracy sample and hold circuit including a first switch, a second switch, a first capacitor, a second capacitor and an amplifier is disclosed. The first capacitor receives and saves a sampling voltage from the first switch during a first period, while the second capacitor receives and saves another sampling voltage from the second switch during a second period. The amplifier has first and second positive input terminals, a negative input terminal, an output terminal and a first input stage and an output stage. Wherein, the first input stage includes a first input set and a second input set. During the first period, the amplifier disables the operation of the first input set and enables the operation of the second input set, while during the second period, the amplifier enables the operation of the first input set and disables the operation of the second input set.

18 Claims, 15 Drawing Sheets

HIGH ACCURACY SAMPLE AND HOLD CIRCUIT HAVING A COMMON NEGATIVE INPUT TERMINAL

CROSS-REFERENCE TO RELATED APPLICATION

This application claims the priority benefit of Taiwan application serial no. 95124105, filed on Jul. 3, 2006. All disclosure of the Taiwan application is incorporated herein by reference.

BACKGROUND OF THE INVENTION

1. Field of the Invention

The present invention relates to a sample and hold circuit, and more particularly, to a sample and hold circuit employing a common negative input terminal and capable of avoiding the distortion of the sampling voltage resulted by the charge redistribution effect.

2. Description of the Related Art

FIG. 1A is a schematic drawing of a conventional sample and hold circuit. The sample apparatus receives an input voltage Vi, samples the received voltage and outputs the sampled voltage Vo. The sample and hold apparatus 100 includes switches 101~104, capacitors 105 and 106 and an operation amplifier 108. The operation amplifier 108 includes an input stage 109 and an output stage 110, and a parasitic capacitor CP is present between the gate of the positive input terminal of the operation amplifier 108 and ground. FIG. 1B is a timing diagram of the control signals 10 and 20 in FIG. 1A. The control signal 10 controls the switches 102 and 103, while the control signal 20 controls the switches 101 and 104. A drawback of the conventional sample and hold circuit is that the sampled and held voltage contains an error produced by the effects of the charge redistribution of the capacitors, the clock feed-through, the channel charge injection and so on. In particular, the error voltage is varied with the different input voltage, which causes a nonlinear output with distortion. Referring to FIGS. 1A and 1B, for illustrating the effects, during the period between 0 and TA0, the control signal 10 takes a high level (assuming the switches are in high active operation). During the period, the switches 102 and 103 are short circuits, while the switches 101 and 104 are open circuits. Thus, the sampling voltage V1 of the capacitor 105 would be output to the amplifier 108 and the parasitic capacitor CP accordingly receives the sampling voltage V1 at this point. Meanwhile, the switch 103 is short circuited, thus, the capacitor 106 has a sampling voltage V2.

Afterwards, during the period between TB0 and TC0, the level of the control signal 10 is reduced, while the control signal 20 takes a high level. Thus, the switches 101 and 104 are short circuits and the switches 102 and 103 are open circuits. At this point, the voltage V2 of the capacitor 106 is output to the amplifier 108. Since the parasitic capacitor CP still retains a sampling voltage of V1 at this time, a charge redistribution effect occurs between the capacitor 106 and the parasitic capacitor CP. Assuming the capacitance of the capacitor 106 is M times that of the capacitance of the parasitic capacitor CP, the calculated voltage received by the operation amplifier 108 should be $V2-[(V2-V1)/(1+M)]$, not the expected output value of V2, which causes a sampling voltage error. In order to reduce the sampling voltage error, the conventional sample and hold circuit reduces the error by increasing the capacitances of the capacitors 105 and 106. However, the increased capacitances not only increase the entire power consumption, but also slow down the sampling speed and require a larger chip area.

FIG. 2A is a schematic drawing of the operation amplifier of a conventional sample and hold circuit. The amplifier 208 herein has two positive terminals P10 and P20 and two negative terminals N10 and N20. The positive terminals P10 and P20 respectively receive two sampling voltages Vin1 and Vin2 which possess two different timings. The output voltage Vo is connected to both the negative terminals N10 and N20 for a feedback function. FIG. 2B is a schematic internal circuit drawing of the operation amplifier of a conventional sample and hold circuit in FIG. 2A. Referring to FIGS. 2A and 2B, the gates of transistors 21 and 24 serve as positive input terminals to receive the voltage Vin1 and Vin2, respectively. The gates of transistors 22 and 23 serve as negative input terminals to receive the voltage Vo for negative feedback. Thereafter, the transistors 21, 22, 23 and 24 are coupled to the output stage 210 to output the voltage Vo. The operation circuit of the conventional sample and hold circuit herein are designed using the transistors 22 and 23 to process the negative terminal inputs in the same functions but the different timings. Such a design scheme requires an increased area for the elements and chip. For the application of driving a display panel, the above-described design scheme would significantly increase the chip area since a display panel employs numerous sample and hold units.

SUMMARY OF THE INVENTION

The objective of the present invention is to provide an amplifier of a high accuracy sample and hold circuit, so as to avoid the errors and the distortion caused by the effects of the charge redistribution of the capacitors, the clock feed-through, the channel charge injection and so on during the sampling and holding and to reduce the area of the sample and hold circuit.

In accordance with the above and other objectives, the present invention provides a high accuracy sample and hold circuit for sampling input signals and outputting the sampled signals. The circuit includes a first switch, a second switch, a first capacitor, a second capacitor and an amplifier. The first terminal of the first switch receives an input signal for being connected to the second terminal of the first switch during a first period. The first terminal of the second switch receives an input signal for being connected to the second terminal of the second switch during a second period. The first terminal of the first capacitor is coupled to the second terminal of the first switch and the second terminal of the first capacitor is coupled to a first voltage for saving the first sample result of the input signal. The first terminal of the second capacitor is coupled to the second terminal of the second switch and the second terminal of the second capacitor is coupled to a second voltage for saving the second sample result of the input signal. The amplifier includes a first positive input terminal, a second positive input terminal, a negative input terminal, an output terminal, a first input stage and an output stage. Wherein, the first positive input terminal is coupled to the second terminal of the first switch, the second positive input terminal is coupled to the second terminal of the second switch, the negative input terminal provides a reference input relative to the inputs at the first positive input terminal and the second positive input terminal and the output terminal is for outputting an output signal. The first input stage includes at least a first input circuit coupled to the first positive input terminal, a second input circuit coupled to the second positive input terminal and a third input circuit coupled to the negative input terminal. The first input stage disables the first input circuit and enables the second input circuit during the first period, and enables the first input circuit and disables the second input circuit during the second period. The output stage is used for providing an output signal to the output terminal of the amplifier according to the outputs of the first input circuit, the second input circuit and the third input circuit.

According to an embodiment of the present invention, the high accuracy sample and hold circuit further includes a first control signal and a second control signal. The first control signal controls the first switch, so as to connect the input signal from the first terminal to the second terminal thereof during the first period and to turn off the first switch during the second period. The second control signal controls the second switch, so as to connect the input signal from the first terminal to the second terminal thereof during the second period and to turn off the second switch during the first period.

According to an embodiment of the present invention, the high accuracy sample and hold circuit further includes a first clock signal attenuator and a second clock signal attenuator. Wherein, the first clock signal attenuator is coupled to the first input circuit for attenuating the received second control signal or an inverted control signal of the second control signal and outputting the attenuated second control signal to the first input circuit, and disabling the first input circuit during the first period and enabling the first input circuit during the second period. In addition, the second clock signal attenuator is coupled to the second input circuit for attenuating the received first control signal or an inverted control signal of the first control signal and outputting the attenuated first control signal to the second input circuit, and enabling the second input circuit during the first period and disabling the second input circuit during the second period.

According to an embodiment of the present invention, the amplifier of the high accuracy sample and hold circuit further includes, a second input stage and includes at least a fourth input circuit coupled to the first positive input terminal, a fifth input circuit coupled to the second positive input terminal, a sixth input circuit coupled to the negative input terminal and a current source. Wherein, the second input stage disables the fourth input circuit and enables the fifth input circuit during the first period, and enables the fourth input circuit and disables the fifth input circuit during the second period.

According to an embodiment of the present invention, the high accuracy sample and hold circuit further includes a first clock signal attenuator and a second clock signal attenuator, wherein the first clock signal attenuator is coupled to the fourth input circuit for attenuating the received second control signal or an inverted control signal of the second signal and outputting the attenuated second control signal to the fourth input circuit, and disabling the fourth input circuit during the first period and enabling the fourth input circuit during the second period. The second clock signal attenuator is coupled to the fifth input circuit for attenuating the received third first control signal or an inverted control signal of the first signal and outputting the attenuated first control signal to the fifth input circuit, followed by enabling the fifth input circuit during the first period and disabling the fifth input circuit during the second period.

Because the sampling and holding mode at the input terminals is switched by the control signals inside the amplifier, and therefore, an effect of the charge redistribution can be avoided from being generated at the sample capacitors and the parasitic capacitors of the input terminals. Another advantage of the present invention is that a common negative input terminal is employed, which is able to reduce the area of the entire circuit. Moreover, the clock signal attenuators utilized by the present invention can lower the voltages of the control signals, which contributes to reduce the clock feed-through interference of the control signals and to decrease the operation voltages of the switches inside the amplifier resulting in a reduced power consumption, so as to achieve the expected functions of the high accuracy sample and hold circuit.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

DESCRIPTION OF THE EMBODIMENTS

Figure 1A:
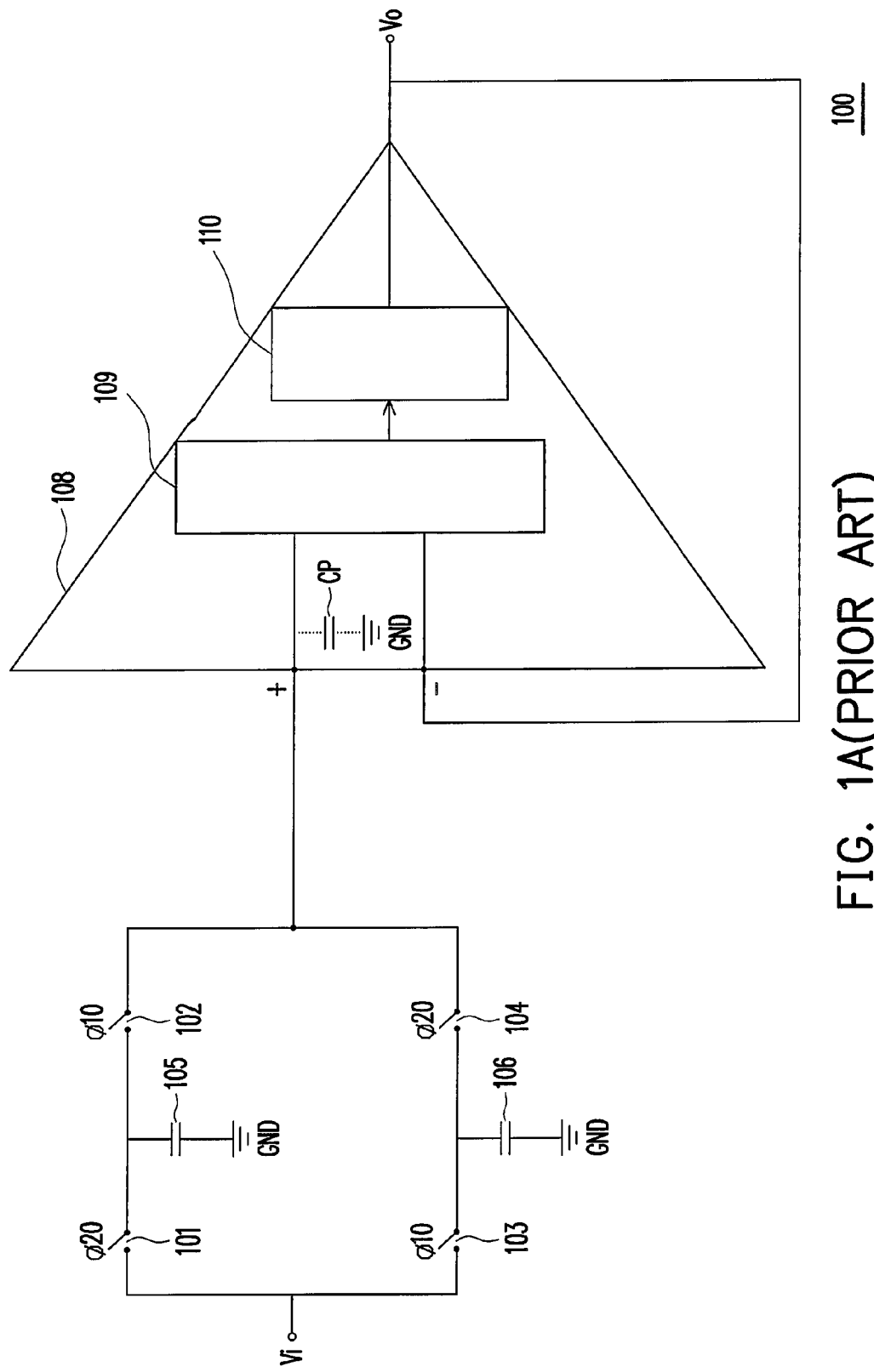
FIG. 1A is a schematic drawing of a conventional sample and hold circuit.
Figure 1B:
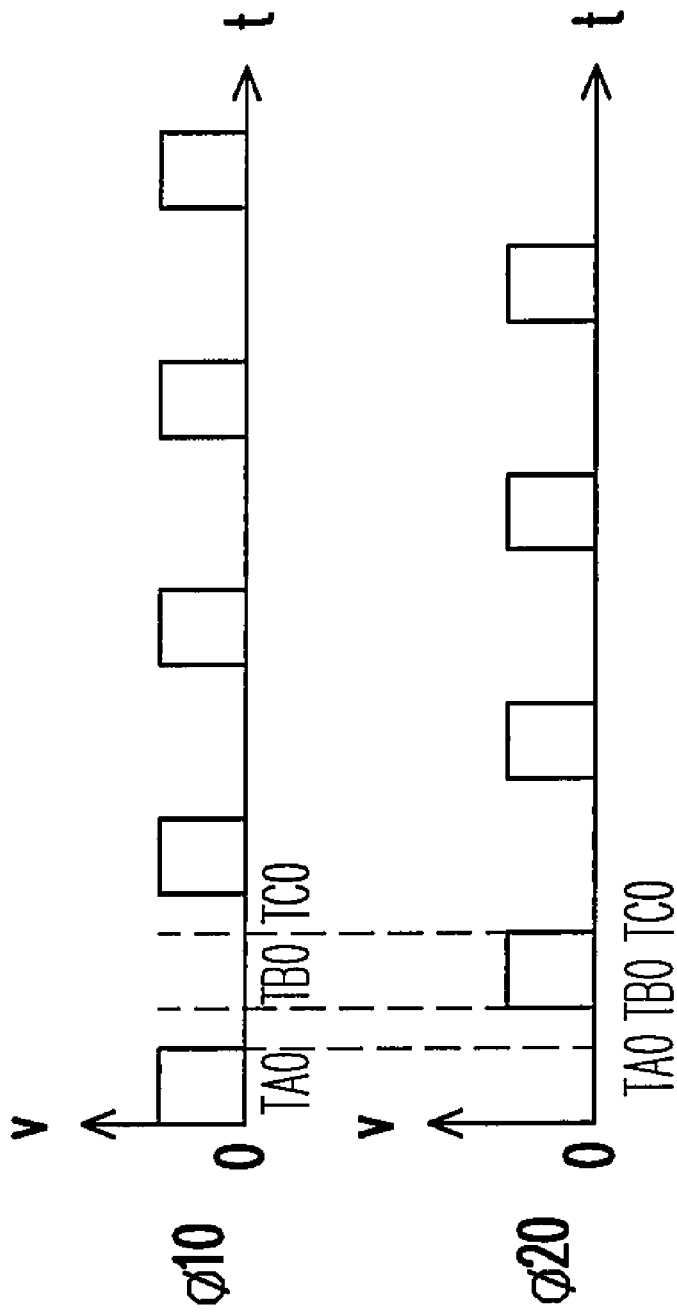
FIG. 1B is a timing diagram of the control signals $\phi 10$ and $\phi 20$ in FIG. 1A.
Figure 2A:
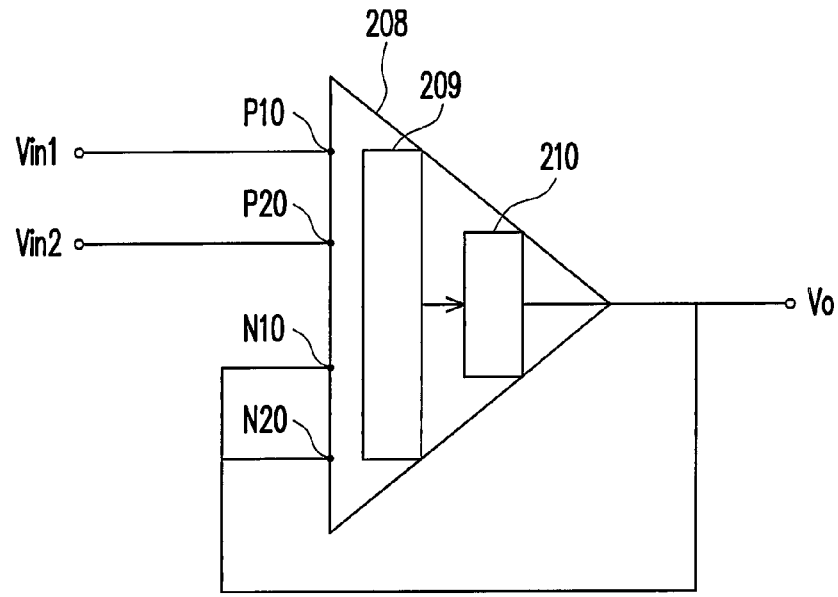
FIG. 2A is a schematic drawing of the operation amplifier of a conventional sample and hold circuit.
Figure 2B:
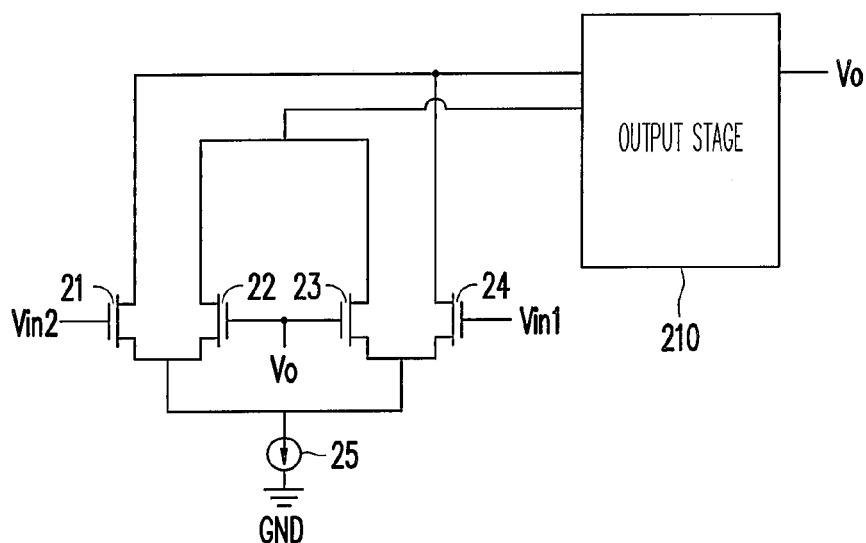
FIG. 2B is a schematic internal circuit drawing of the operation amplifier of a conventional sample and hold circuit in FIG. 2A.
Figure 3A:
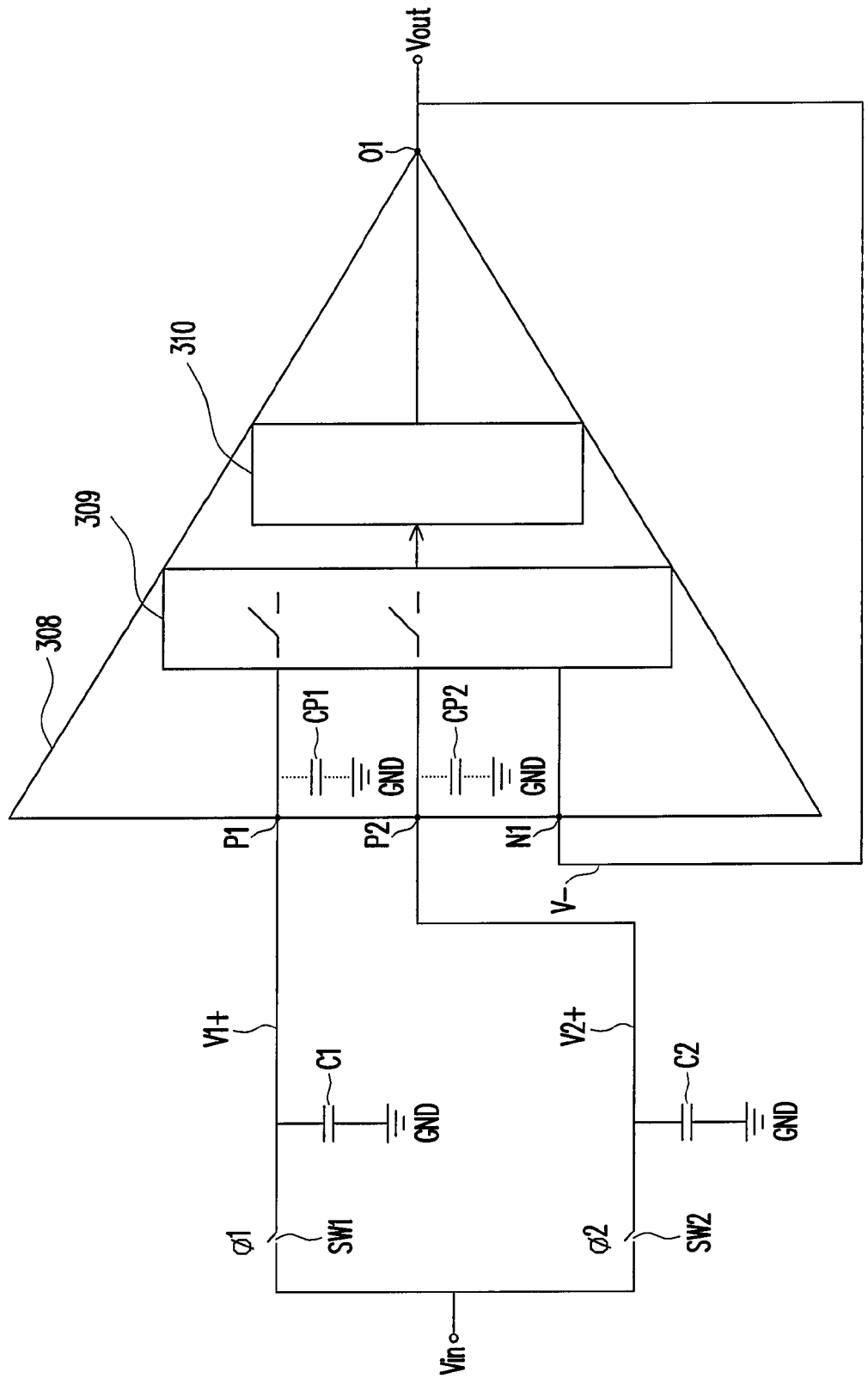
FIG. 3A is a schematic drawing of a high accuracy sample and hold circuit according to an embodiment of the present invention.
Figure 3B:
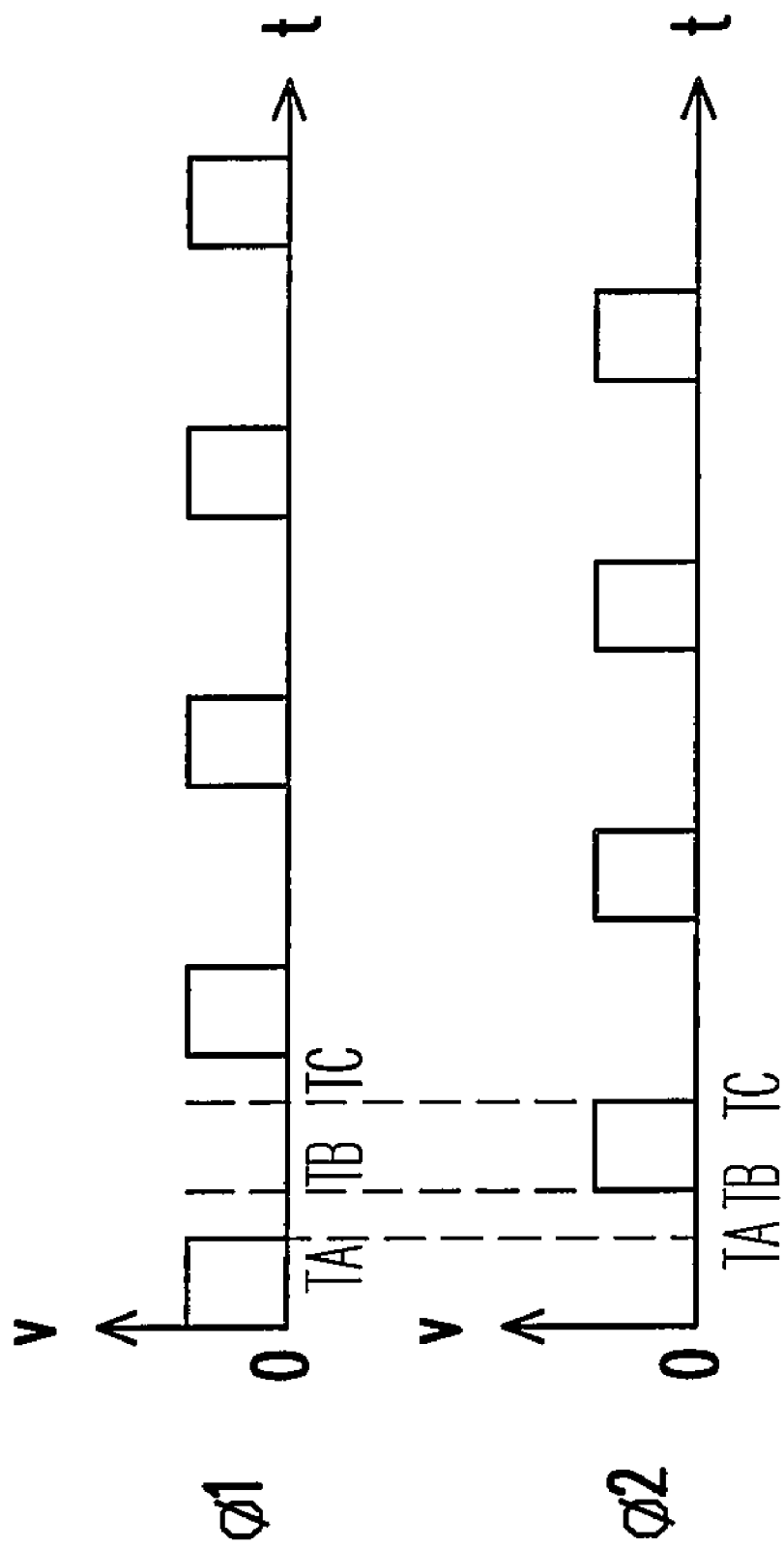
FIG. 3B is a timing diagram of the control signals $\phi 1$ and $\phi 2$ according to an embodiment of the present invention.

FIG. 3A is a schematic drawing of a high accuracy sample and hold circuit according to an embodiment of the present invention. The sample and hold circuit includes a first switch SW1, a second switch SW2, a first capacitor C1, a second capacitor C2 and an amplifier 308. Usually, the input terminals P1 and P2 of the amplifier 308 respectively contain a parasitic capacitor CP1 and a parasitic capacitor CP2. The first switch SW1 is controlled by a control signal 1, while the second switch SW2 is controlled by a control signal 2. FIG. 3B is a timing diagram of the control signals 1 and 2 according to an embodiment of the present invention. Referring to FIGS. 3A and 3B, during a first period between 0 and TA, the control signal 1 takes a high level and the first switch SW1 receives an input signal Vin and connects the input signal Vin to a terminal of the first capacitor C1 and the parasitic capacitor CP1. Another the terminal of the first capacitor C1 is connected to a first voltage (for example, the grounding voltage GND). At this point, the first capacitor C1 and the parasitic capacitor CP1 are adopted for saving a first sample result of the input signal. Since both the first capacitor C1 and the parasitic capacitor CP1 simultaneously sample (save) the input signal at the time, no charge redistribution effect occurs between the parasitic capacitor CP1 inside the amplifier 308 and the sample capacitor C1.

During a second period between TB and TC, the control signal φ2 takes a high level and a terminal of the second switch SW2 receives the input signal Vin and connects the input signal Vin to a terminal of the second capacitor C2 and the parasitic capacitor CP2. Another terminal of the second capacitor C2 is connected to a second voltage (for example, the grounding voltage GND). At this point, the second capacitor C2 and the parasitic capacitor CP2 are adopted for saving a second sample result of the input signal. Since both the second capacitor C2 and the parasitic capacitor CP2 simultaneously sample (save) the input signal at the time, therefore, no charge redistribution effect occurs between the parasitic capacitor CP2 inside the amplifier 308 and the sample capacitor C2.

The amplifier 308 includes a first positive input terminal P1, a second positive input terminal P2, a negative input terminal N1, an output terminal O1, an input stage 309 and an output stage 310. The first positive input terminal P1 is coupled to a terminal of the first switch SW1 to receive a sampling voltage V1+, the second positive input terminal P2 is coupled to the second switch SW2 to receive a sampling voltage V2+. The negative input terminal N1 provides a reference voltage V− relative to the first positive input terminal P1 and the second positive input terminal P2; thus the first positive input terminal P1 and the second positive input terminal P2 share the common negative input terminal N1. In order for the amplifier 308 to serve as a buffer at the time, the negative input terminal N1 needs to be coupled to the output terminal O1 of the amplifier to establish a negative feedback loop. The input stage 309 is further able to alternatively receive the sampling voltage V1+ and the voltage V2+ in response to different timings based on the internal switching design, followed by outputting a voltage Vout through the output stage 310.

Figure 3C:
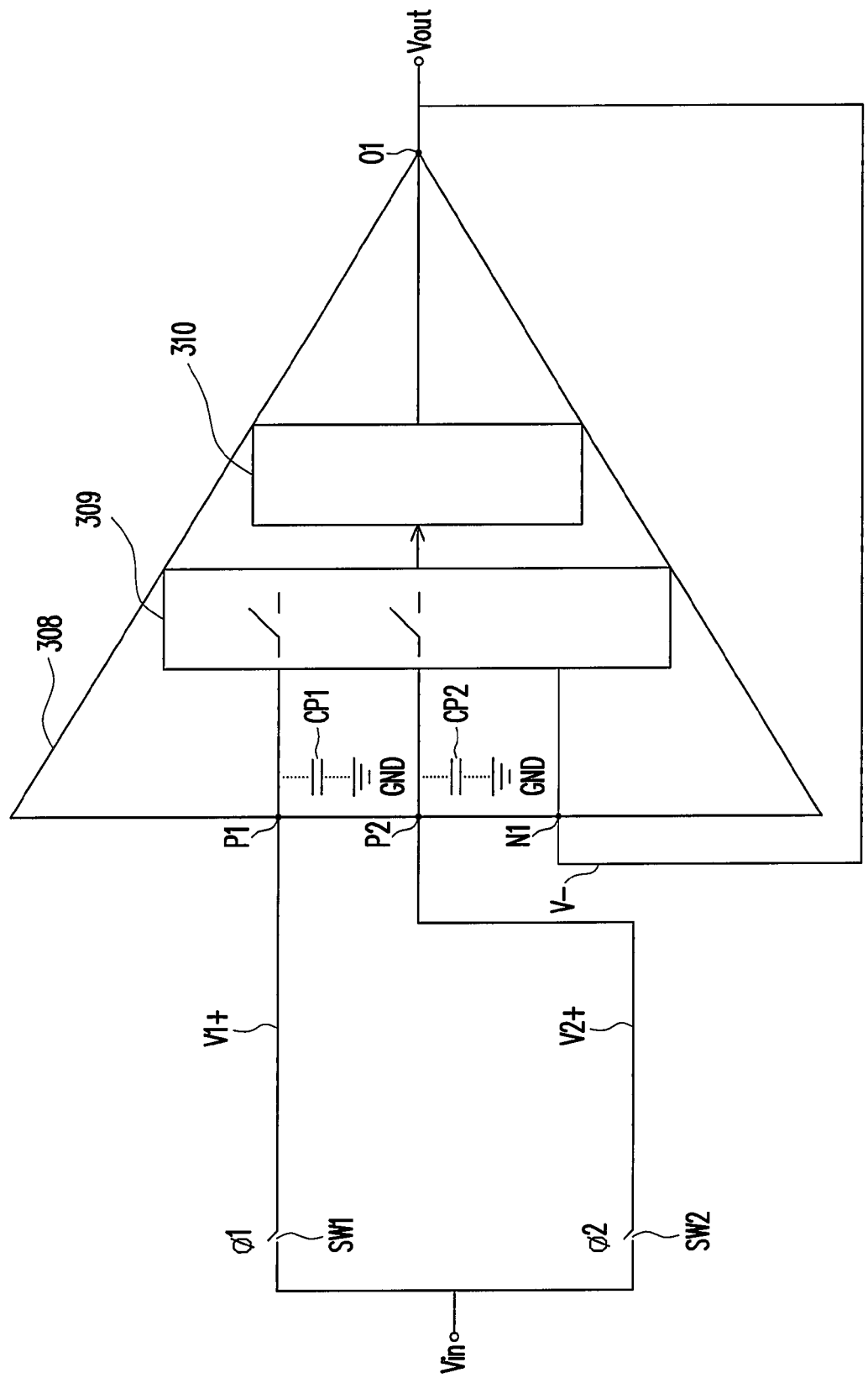
FIG. 3C is a schematic drawing of a high accuracy sample and hold circuit according to another embodiment of the present invention.

FIG. 3C is a schematic drawing of a high accuracy sample and hold circuit according to another embodiment of the present invention. The difference of the embodiment from the above-described embodiment resides in that the present embodiment uses the parasitic capacitors CP1 and CP2 of the amplifier itself for sampling. The input voltage Vin of the circuit is output alternatively through the switches SW1 and SW2 which are alternatively on/off according to the timings of the control signals φ1 and φ2, and served as the sampling voltages V1+ and V2+ for the succeeding sampling. The input terminals P1 and P2 of the amplifier 308 respectively receive the sampling voltages V1+ and V2+, wherein the input terminals P1 and P2 share the common negative input terminal N1 to obtain a reference voltage and to be coupled to the output terminal O1 for establishing a negative feedback loop. It is obvious that the input voltage V− of the negative input terminal N1 is the same as the output voltage Vout of the amplifier. In response to the alternative switching between the switch SW1 and the switch SW2, the parasitic capacitors CP1 and CP2 existed inside the amplifier 308 sample the voltages come from outside and save the sampled voltages in the parasitic capacitors CP1 and CP2. After that, the saved voltages are alternatively output from the parasitic capacitors CP1 and CP2 by means of the switching inside the input stage 309, and finally serve as the output voltage Vout for outputting from the output stage 310.

In the circuits of FIGS. 3A and 3C, the negative input terminal N1 is directly coupled to the output terminal O1. However, it would be apparent to those skilled in the art that the connection between the negative input terminal N1 and the output terminal can modified to achieve the purpose of the present invention. In fact, to achieve the expected negative feedback function, a resistor can be coupled between the negative input terminal and the output terminal, or the negative input terminal and the output terminal may be connected in parallel to the ground.

Figure 4:
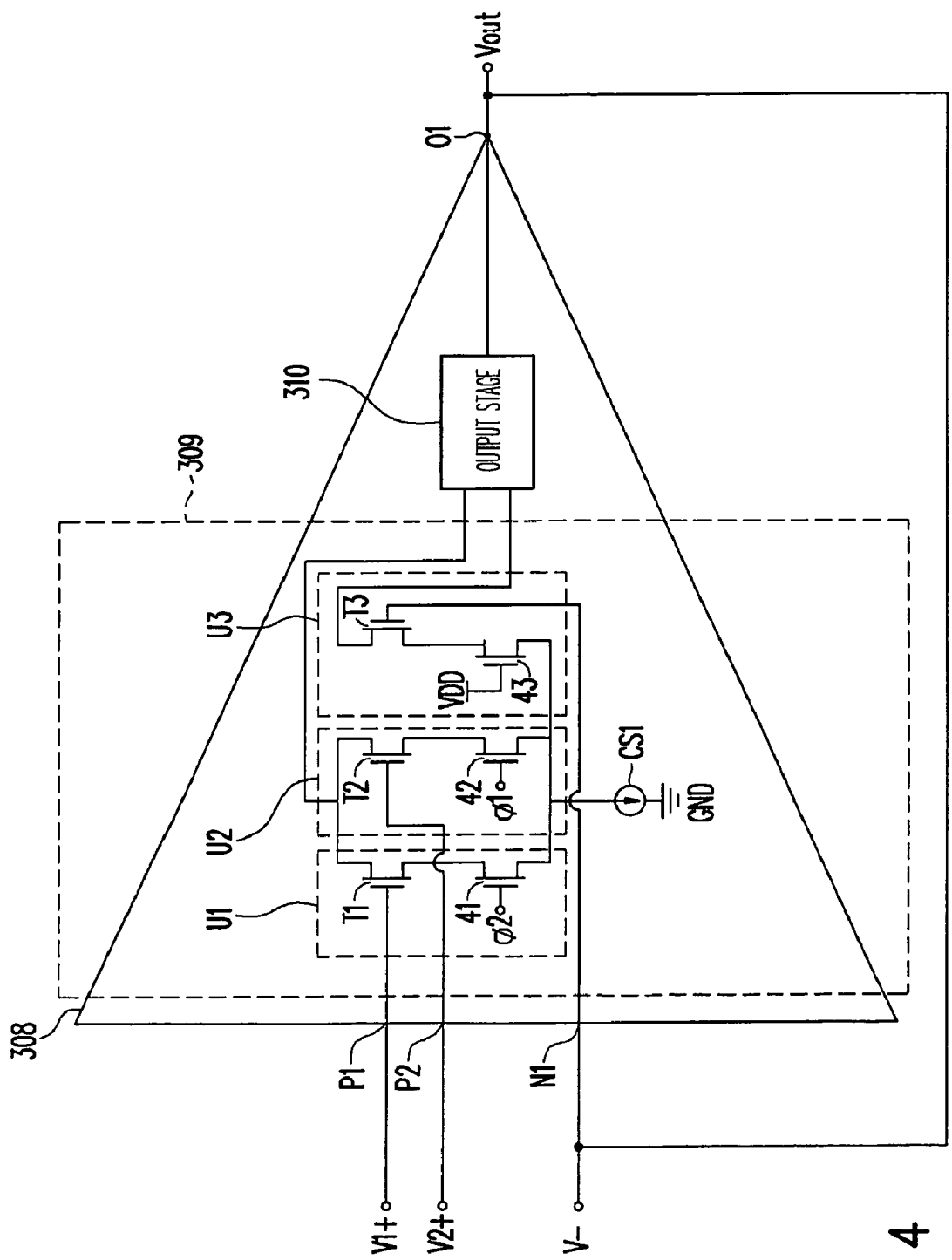
FIG. 4 is a schematic drawing of an implementation circuit of the amplifier in FIG. 3A, wherein N-type MOS transistors are used for sampling the voltages.

FIG. 4 is a schematic drawing of an implementation circuit of the amplifier of the high accuracy sample and hold circuit in FIG. 3A, wherein N-type MOS transistors are used for sampling the voltages. It can be seen from the circuit drawing of the amplifier that the detail structures regarding outputting the voltage by means of internal switching and sharing the common negative output terminal are given. The first input stage 309 of the amplifier 308 has a first input circuit U1, a second input circuit U2, a third input circuit U3 and a current source CS1. The first input circuit U1 is coupled to the first positive input terminal P1, the second input circuit U2 is coupled to the second positive input terminal P2 and the third input circuit U3 is coupled to the negative input terminal N1. The current source CS1 is coupled to the first input circuit U1, the second input circuit U2 and the third input circuit U3 for providing a driving current, while another terminal of the current source CS1 is coupled to the grounding voltage.

Referring to FIGS. 3B and 4, the first input circuit U1 includes a first transistor T1 and a transistor 41. The gate of the first transistor T1 is coupled to the first positive input terminal P1 to receive the input voltage V1+ and the drain thereof is coupled to the output stage 310. The transistor 41 herein is serves as the third switch, which enables or disables the first input circuit according to the control signal 2.

The second input circuit U2 includes a second transistor T2 and a transistor 42. The gate of the second transistor T2 is coupled to the second positive input terminal P2 to receive the input voltage V2+ and the drain thereof is coupled with the output stage 310. The transistor 42 herein serves as the fourth switch, which enables or disables the second input circuit U2 according to the control signal 1. The third input circuit U3 includes a third transistor T3 and a transistor 43. The gate of the third transistor T3 is coupled to the negative input terminal N1 to receive the input voltage V−, and the transistor 42 herein serves as the fifth switch, wherein the gate of the transistor 43 (the fifth switch) is coupled to a voltage VDD which is different from the connections of the above-mentioned transistors 42 and 43. The third input circuit U3 serves as an impedance matching to other input circuits. The current source CS1 is respectively coupled to the transistors 41, 42 and 43 serving as switches to provide all the input circuits with the required offset voltage currents.

Referring to FIGS. 3B and 4, the operation principle of the sample and hold circuit of the embodiment is explained as follows. During the first period between 0 and TA, the control signal 1 takes a high level, while the control signal 2 takes a low level. At this time, the fourth switch is a short circuit, while the third switch is an open circuit; the second input circuit U2 is enabled to capture the voltage V2+, while the first input circuit U1 is disabled. During the second period between TB and TC, the control signal 2 takes a high level, while the control signal 1 takes a low level. At this time, the third switch is a short circuit, while the fourth switch is an open circuit; the first input circuit U1 is enabled to capture the voltage V1+, while the second input circuit U2 is disabled. The input circuits U1 and U2 control the inputs of the voltages V1+ and V2+ in response to the alternative activations of the control signals 1 and 2. The alternative inputs of the voltages V1+ and V2+ make the third input circuit U3 possible to be shared as the input of the negative terminal, which saves the elements and achieves the expected function of the high accuracy sample and hold.

Figure 5A:
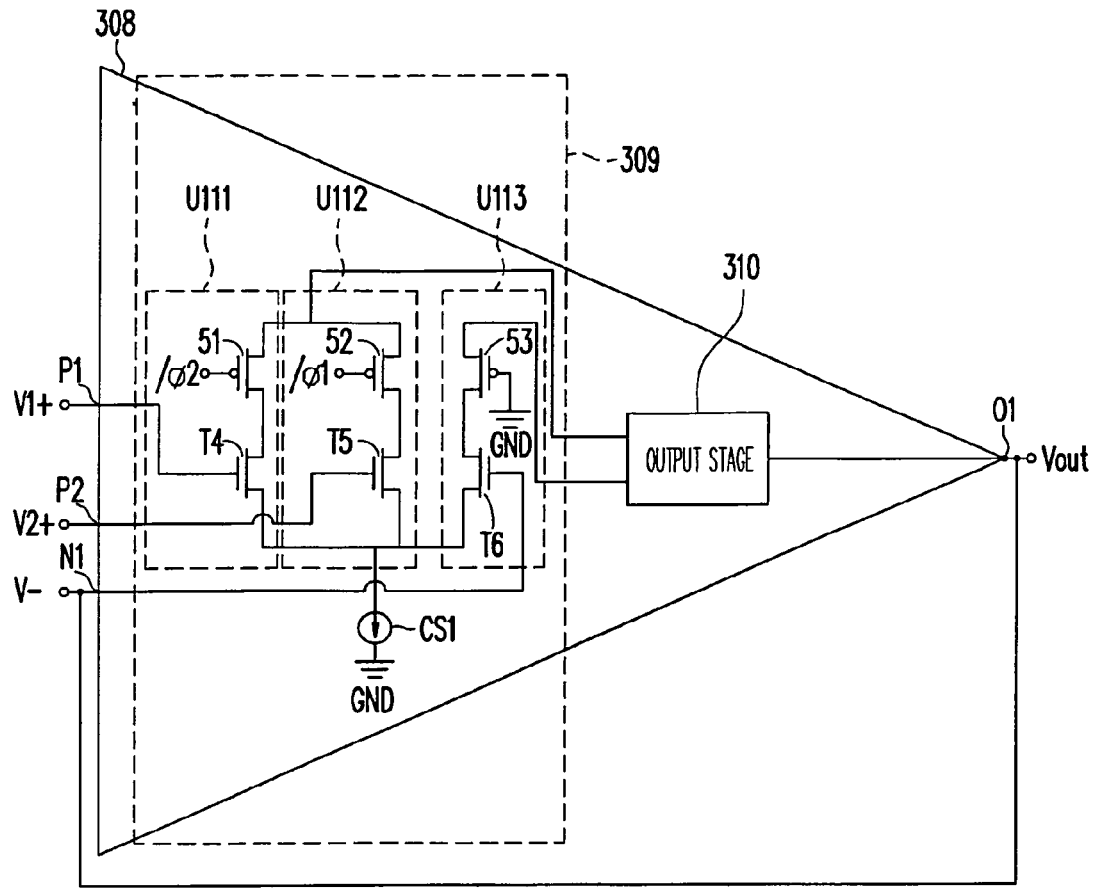
FIG. 5A is a schematic drawing of another implementation circuit of the amplifier in FIG. 3A, wherein N-type MOS transistors are used for sampling the voltages.

FIG. 5A is a schematic drawing of another implementation circuit of the amplifier, wherein N-type MOS transistors serve as the required transistors T4, T5 and T6 for sampling the voltages, while P-type MOS transistors serve as the switches 51, 52 and 53. The major difference of the FIG. 5A from FIG. 4 is that the transistors serve as switches and the transistors for sampling in the current source CS1 and the input circuits have different wiring connections. Different from coupling to the transistors serving as the switches in FIG 4, the current source CS1 in the first input stage 309 is coupled to the transistors T4, T5 and T6 which are in charge of sampling voltages, while another terminal of the current source CS1 is coupled to the grounding voltage GND. The first input circuit U111, the second input circuit U112 and the third input circuit U113 are respectively coupled to the first positive input terminal P1, the second positive input terminal P2 and the negative input terminal N1.

Figure 5B:
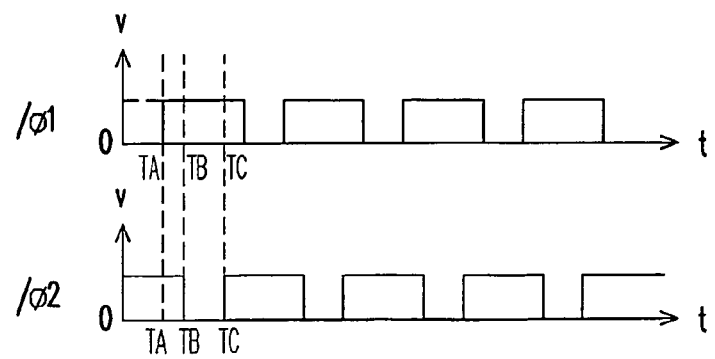
FIG. 5B is a timing diagram of the inverted control signals $/\phi 1$ and $/\phi 2$ according to an embodiment of the present invention.

FIG. 5B is a timing diagram of the inverted control signals /1 and /2. During the first period between 0 and TA, the inverted control signal /1 takes a low level, while the inverted control signal /2 takes a high level. During the second period between TB and TC, the inverted control signal /1 takes a high level, while the inverted control signal /2 takes a low level. Referring to FIGS. 5A and 5B, the transistor 51 of the input circuit U111 is a P-type MOS transistor and serves as the third switch for receiving the inverted control signal /2, so as to determine when the input circuit U111 is enabled. The transistor 52 of the input circuit U112 is also a P-type MOS transistor and serves as the fourth switch for receiving the inverted control signal /1, so as to determine when the input circuit U112 is enabled. The third transistor T6 in the input circuit U113 is connected to the input terminal N1 for receiving the voltage V− as the common terminal of the input circuits U111 and U112. The P-type MOS transistor 53 is coupled to the grounding voltage GND to make the input circuit U113 in current-on status and adopted for an impedance matching to the input circuits U111 and U112.

During the first period between 0 and TA, the input circuit U111 of the amplifier 308 is accordingly disabled under the control of the transistor 51, the input circuit U112 is enabled to capture the voltage V2+ under the control of the transistor 52 and the input circuit U113 receives the voltage V− serving as the reference voltage. In this way, the input circuits U112 and U113 output a voltage to the output stage 310, and then the output stage 310 outputs the voltage Vout through the output terminal O1.

During the second period between TB and TC, the input circuit U111 of the amplifier 308 is enabled to capture the voltage V1+ under the control of the transistor 51, the input circuit U112 is disabled under the control of the transistor 52 and the input circuit U113 receives the voltage V− serving as the reference voltage. In this way, the input circuits U111 and U113 output a voltage to the output stage 310, and then the output stage 310 outputs the voltage Vout through the output terminal O1. The the input circuits U111 and U112. alternatively input the voltages V1+ and V2+, use the same negative input circuit U113 to receive the reference voltage V−, so as to eliminate the charge redistribution effect and to save the elements.

Figure 6:
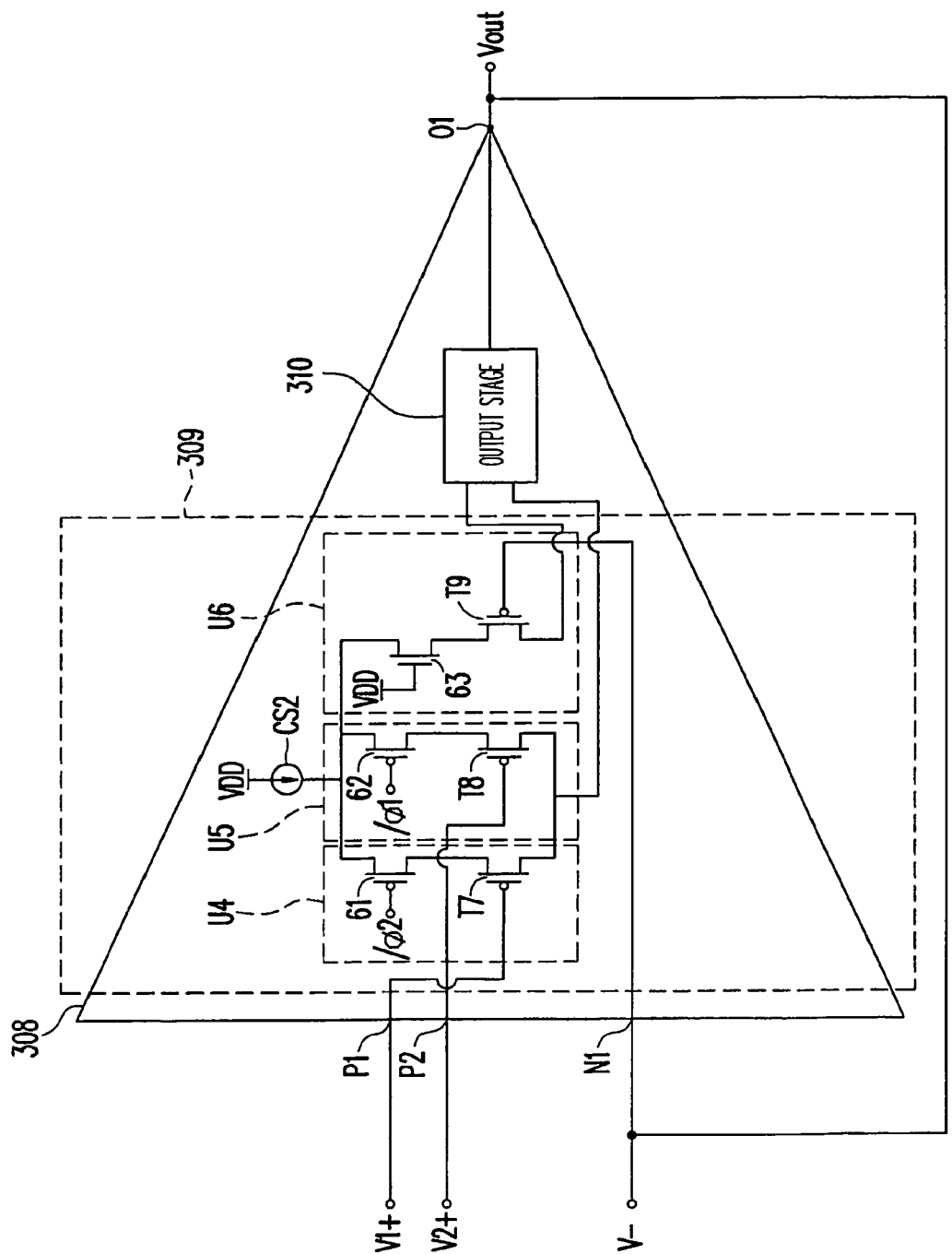
FIG. 6 is a schematic drawing of an implementation circuit of the amplifier in FIG. 3A, wherein P-type MOS transistors are used for sampling the voltages.

In FIGS. 4 and 5A, N-type MOS transistors serve as the required transistors for sampling the voltages. FIG. 6 is a schematic drawing of an implementation circuit, wherein P-type MOS transistors are used for sampling the voltages. Referring to FIG. 6, a terminal of the current source CS2 in the input stage 309 is coupled to the voltage VDD, while another terminal thereof is coupled to the first input circuit U4, the second input circuit U5 and the third input circuit U6 to provide a driving current. Referring to FIGS. 5B and 6, the P-type MOS transistor 61 of the first input circuit U4 serves as the third switch to control the first transistor T7. Once the inverted control signal/2 is input to the third switch, the input terminal P1 is disabled during the first period between 0 and TA, while the input terminal P1 is enabled and captures the voltage V1+ during the second period between TB and TC. On the other hand, the P-type MOS transistor 62 of the second input circuit U5 serves as the fourth switch to control the second transistor T8. Once the fourth switch receives the inverted control signal /1, the input terminal P2 is enabled and captures the voltage V2+ during the first period between 0 and TA, while the input terminal P2 is disabled during the second period between TB and TC. The first input circuit U4 and the second input circuit U5 share the third input circuit according to the different timings and output voltages to the output stage 310 which sends the output voltage Vout to the output terminal O1 for output. Wherein, the third transistor T9 of the third input circuit. U6 captures the reference voltage V− from the negative input terminal N1, while the N-type transistor 63 serves as the switch of the third input circuit U6 and the gate of the N-type transistor 63 is coupled to the voltage VDD, so as to make the switch transistor 63 current-on between the source and the drain thereof.

Figure 7:
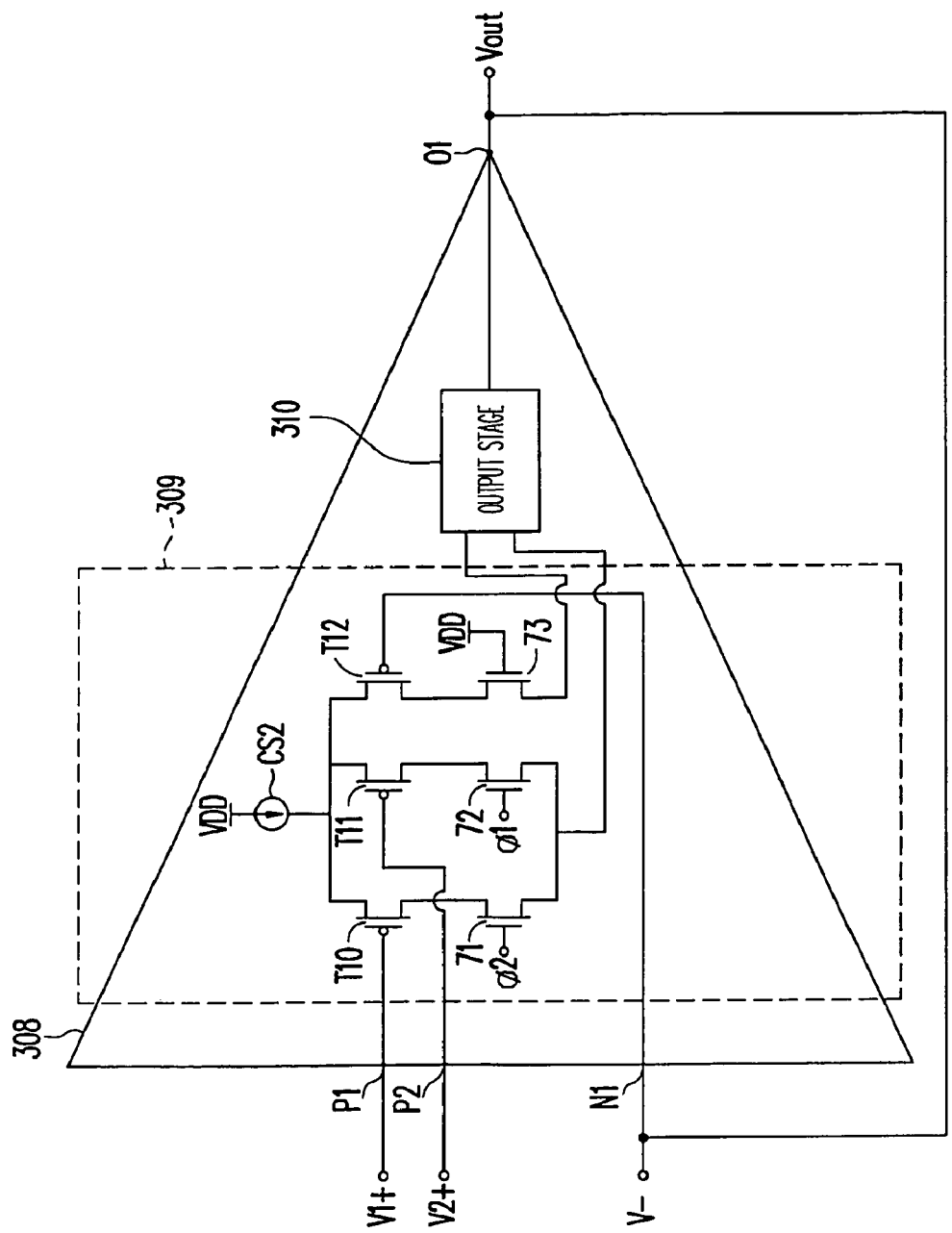
FIG. 7 is a schematic drawing of another implementation circuit of the amplifier in FIG. 3A, wherein P-type MOS transistors are used for sampling the voltages.

FIG. 7 is a schematic drawing of another implementation circuit of the amplifier, wherein P-type MOS transistors, in the same way as in FIG. 6, are used for sampling signals. The most different feature of FIG. 7 from FIG. 6 resides in that the wiring connections between the current source CS2 and the transistors served as switches and the transistors served for sampling in all the input circuits are quite different. In the input stage 309 of FIG. 7, the current source CS2 is coupled with the first transistor T10, the second transistor T11 and the third transistor T12, all of which are charged in sampling voltages; while the current source CS2 in FIG. 6 is coupled with the switch transistors. The current source CS2 in FIG. 7 further provides all the input circuits with the required driving currents, and another terminal of the current source CS2 is coupled with the voltage VDD. Referring to FIGS. 7 and 3B, during the first period between 0 and TA, the transistor 72 serving as the fourth switch and the transistor 73 serving as the fifth switch are on, wherein the transistor 71 receives the control signal 2, the transistor 72 receives the control signal 1 and the gate of the transistor 73 is coupled to the voltage VDD. Accordingly, the second transistor T11 and the second transistor T12 respectively capture the voltage V2+ and the voltage V− at the input terminals P2 and N1. Afterwards, the captured voltages are sent to the output stage 310 and the voltage Vout is output by the output stage 310 via the output terminal O1.

During the second period between TB and TC, the transistor 71 serving as the third switch and the transistor 73 serving as the fifth switch are on. The first transistor T10 and the third transistor T12 respectively capture the voltage V1+ and the voltage V− at the input terminals P1 and N1. Afterwards, the captured voltages are sent to the output stage 310 and the voltage Vout is output by the output stage 310 via the output terminal O1.

Figure 8A:
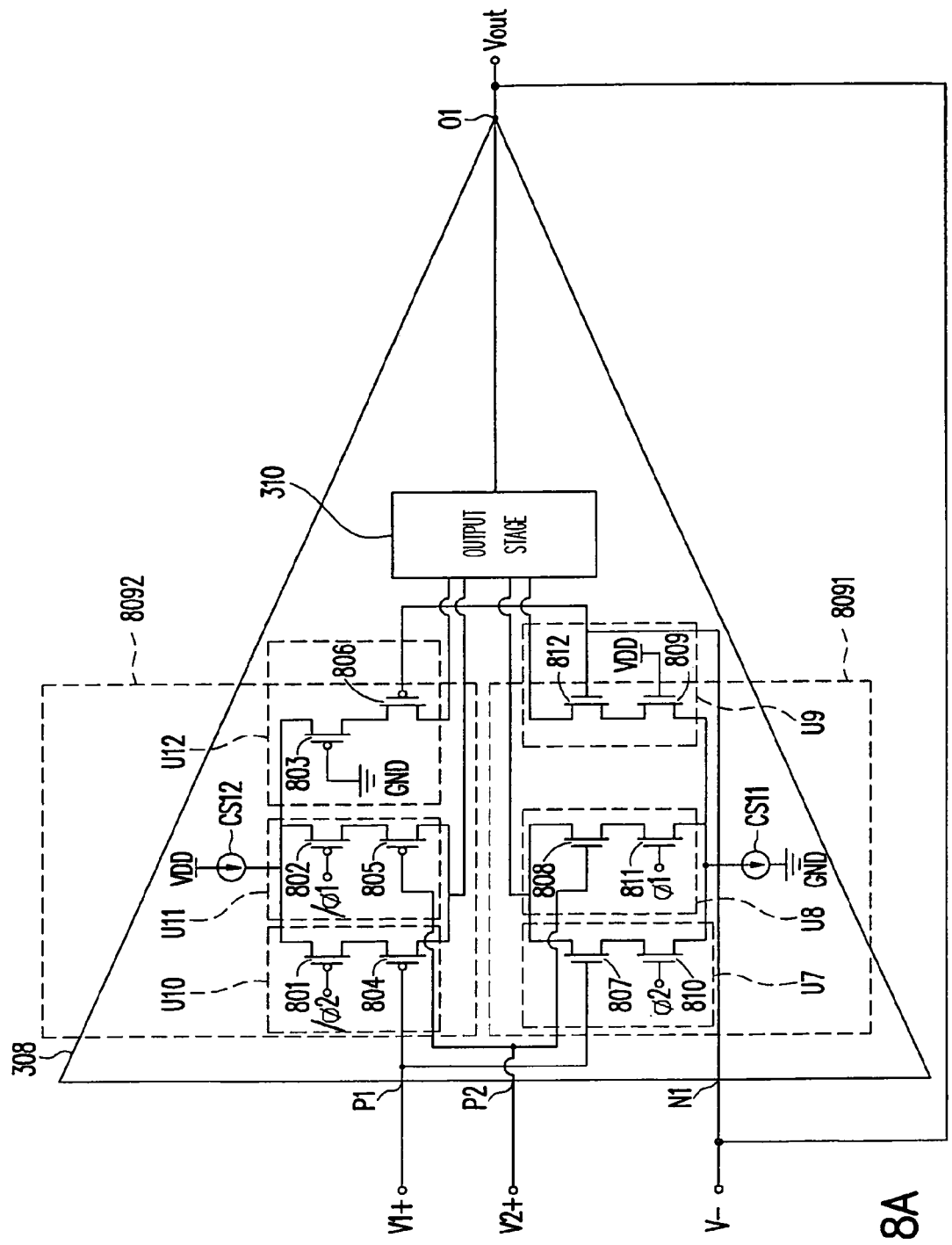
FIG. 8A is a schematic drawing of an implementation of the rail-to-rail circuit of the amplifier in FIG. 3A.

FIG. 8A is a schematic drawing of an implementation of the rail-to-rail circuit of the amplifier. To achieve the rail-to-rail function, all the sampling voltages are simultaneously connected to the P-type MOS input transistors and the N-type MOS input transistors, so that the circuit is able to precisely sample and hold voltages with a wide range and a minor error. The amplifier 308 employs the first input stage 8091 and the second input stage 8092 to receive the sampling voltages and send the received voltages to the output stage 310, and output the voltage Vout through the output terminal O1. A terminal of the current source CS11 of the first input stage 8091 is coupled to the grounding voltage GND and terminal of the current source CS12 of the second input stage 8092 is coupled to the voltage VDD.

The first input stage 8091 includes a first input circuit U7, a second input circuit U8 and a third input circuit U9. Wherein, the transistor 810 of the first input circuit U7 is coupled to the current source CS11 and serves as the third switch, while the gate of the first transistor 807 is coupled to the first positive input terminal P1 to capture the voltage V1+; the transistor 811 of the second input circuit U8 is coupled to the first current source CS11 and serves as the fourth switch, while the gate of the second transistor 808 is coupled to the second positive input terminal P2 to capture the voltage V2+. The N-type MOS transistor 809 of the third input circuit U9 serves as the fifth switch, wherein the gate of the N-type transistor 809 is coupled to the voltage VDD, so that the third transistor 812 of the third input circuit U9 is able to receive the voltage V− at the negative terminal N1 free from the influence of the control signals.

The second input stage 8092 includes a fourth input circuit U10, a fifth input circuit U11 and a sixth input circuit U12. Wherein, the transistor 801 of the fourth input circuit U10 is coupled to the current source CS12 and serves as the sixth switch, while the gate of the fourth transistor 804 of the fourth input circuit U10 is coupled to the first positive input terminal P1 to capture the voltage V1+; the transistor 802 of the fifth input circuit U11 is coupled to the current source CS12 and serves as the seventh switch, while the gate of the fifth transistor 805 of the fifth input circuit U11 is coupled to the second positive input terminal P2 to capture the voltage V2+. The P-type MOS transistor 803 of the sixth input circuit U12 serves as the eighth switch, wherein the gate of the P-type transistor 803 is coupled to the grounding voltage GND, so that the sixth transistor 806 of the sixth input circuit U9 is able to continuously receive the voltage V− at the negative terminal N1.

Referring to FIGS. 8A, 3B and 5B, during the first period between 0 and TA, the inverted control signal /φ1 and the control signal φ1 respectively take the low level and the high level, and are respectively input to the gates of the transistors 802 and 811, so that the transistors 802 and 811 are on between the drains and the sources thereof, the transistors 805 and 808 capture the voltage V2+ at the input terminal P2 and the transistors 806 and 812 capture the voltage V− at the input terminal N1, and send all the captured voltages to the output stage 310. The P-type MOS transistor 803 is coupled to the grounding voltage GND and the N-type MOS transistor 809 is coupled to the voltage VDD, so that the transistors 803 and 809 are on between the sources and the drains thereof, where the transistors 803 and 809 are adopted for an impedance matching.

During the second period between TB and TC, the inverted control signal /φ2 and the control signal φ2 respectively take the low level and the high level, and are respectively input to the gates of the transistors 801 and 810, so that the transistors 801 and 810 are on between the drains and the sources thereof, the transistors 804 and 807 capture the voltage V1+ at the input terminal P1 and the transistors 806 and 812 capture the voltage V− at the input terminal N1, followed by sending all the captured voltages to the output stage 310. It should be noted that after all the sampling voltages are input, the input stage 8091 and the input stage 8092 simultaneously output the voltages to the output stage 310, where the output voltage Vout is output via the output terminal O1.

Figure 8B:
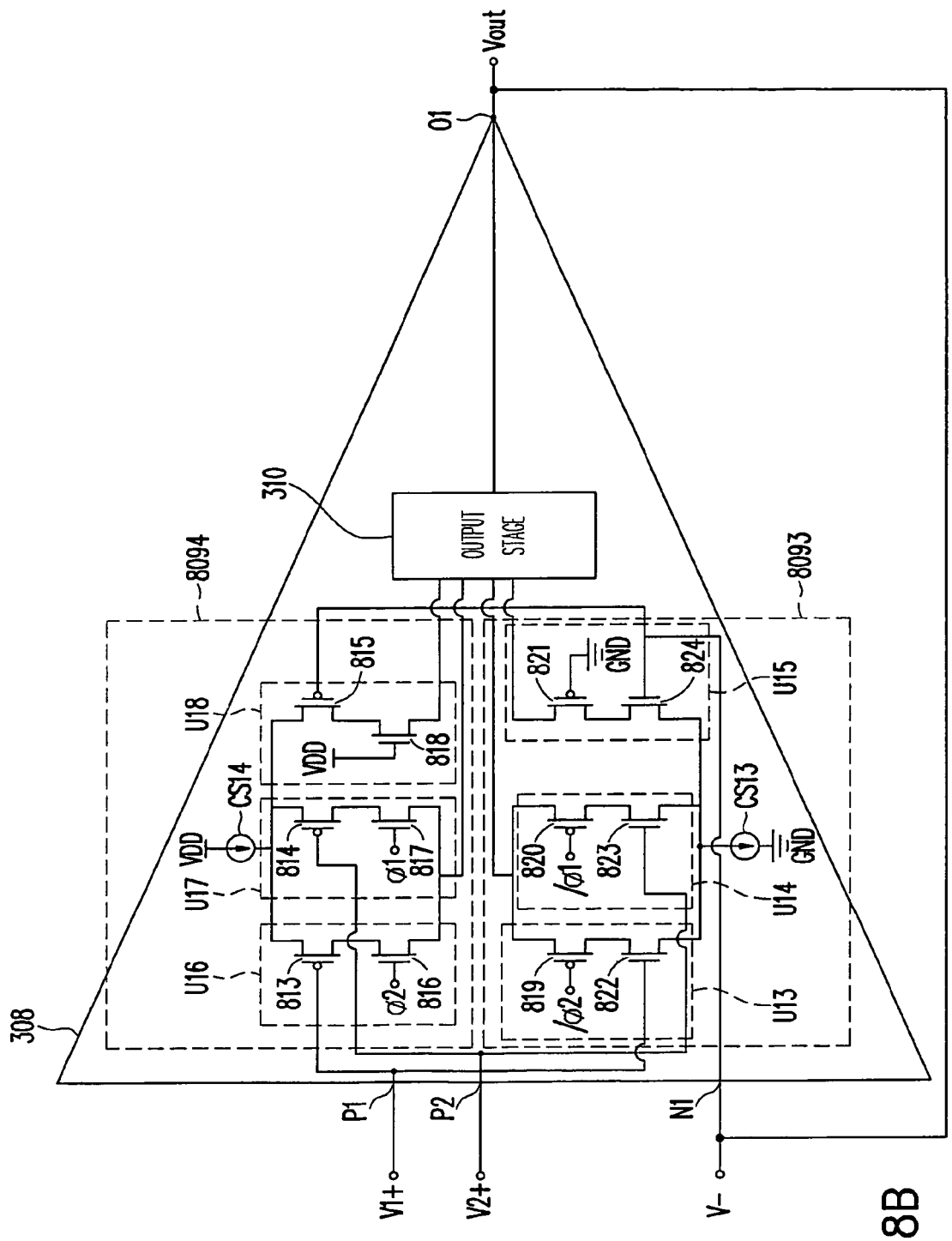
FIG. 8B is a schematic drawing of another implementation of the rail-to-rail circuit of the amplifier in FIG. 3A.

FIG. 8B is a schematic drawing of another implementation of the rail-to-rail circuit of the amplifier. The difference of FIG. 8B from FIG. 8A resides in that the transistor types in all the input circuits are not the same and the wiring connections between the current source and the transistors are different. In each of the input circuits of FIG. 8A, the transistors are same, either N-type MOS transistors or P-type MOS transistors, while in each of the input circuits of FIG 8B, there are an N-type MOS transistor and a P-type MOS transistor.

In the first input stage 8093, the current source CS13 is respectively coupled to a first input circuit U13, a second input circuit U14 and a third input circuit U15. Wherein, the transistor 819 serves as the third switch of the first input circuit U13, the transistor 820 serves as the fourth switch of the second input circuit U14 and the P-type MOS transistor 821 serves as the fifth switch of the third input circuit U15. The gate of the first transistor 822 is coupled to the first positive input terminal P1, the gate of the second transistor 823 is coupled to the second positive input terminal P2. In addition, the gate of the P-type transistor 821 is coupled to the grounding voltage GND, so that the third transistor 824 of the third input circuit U15 is able to capture the voltage V− at the negative terminal N1 free from the influence of the control signals.

In the second input stage 8094, the current source CS14 is respectively coupled to a fourth input circuit U16, a fifth input circuit U17 and a sixth input circuit U18. Wherein, the transistor 816 serves as the sixth switch of the fourth input circuit U16, the transistor 817 serves as the seventh switch of the fifth input circuit U17 and the N-type MOS transistor 818 serves as the eighth switch of the sixth input circuit U18. The gate of the tenth transistor 813 is coupled to the first positive input terminal P1, the gate of the fifth transistor 814 is coupled to the second positive input terminal P2. In addition, the gate of the N-type transistor 818 is coupled to the grounding voltage GND, so that the sixth transistor 815 of the sixth input circuit U18 is able to capture the voltage V− at the negative terminal N1 free from the influence of the control signals.

Referring to FIGS. 8B, 3B and 5B, during the first period between 0 and TA, the gates of the transistors 817 and 820 respectively receive the control signal φ1 and the inverted control signal /φ1, so that the transistors 817 and 820 are between the drains and the sources thereof, the transistors 814 and 823 capture the voltage V2+ at the input terminal P2 and the transistors 815 and 824 capture the voltage V− at the input terminal N1, and send all the captured voltages to the output stage 310. During the second period between TB and TC, the gates of the transistors 816 and 819 respectively receive the control signal φ2 and the inverted control signal /φ2, so that the transistors 816 and 819 are on between the drains and the sources thereof, the transistors 813 and 822 capture the voltage V1+ at the input terminal P1 and the transistors 815 and 824 capture the voltage V− at the input terminal N1, and send all the captured voltages to the output stage 310. It should be noted that after all the sampling voltages are input, the input stage 8093 and the input stage 8094 simultaneously output the voltages to the output stage 310, where the output voltage Vout is output via the output terminal O1.

Figure 9:
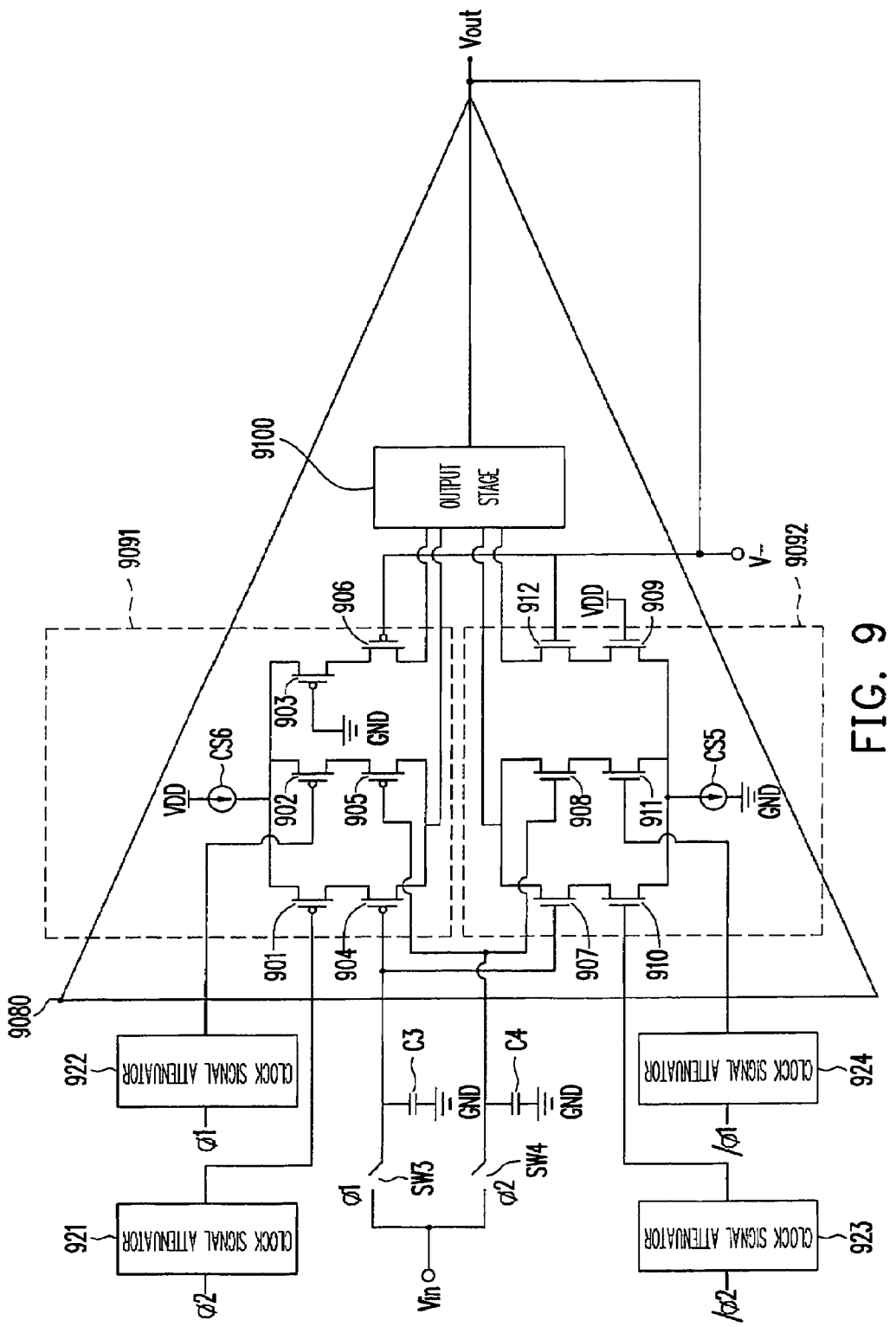
FIG. 9 is a schematic drawing of an embodiment of the rail-to-rail circuit having clock signal attenuators in the high accuracy sample and hold circuit of FIG. 3A according to the present invention.
Figure 10A:
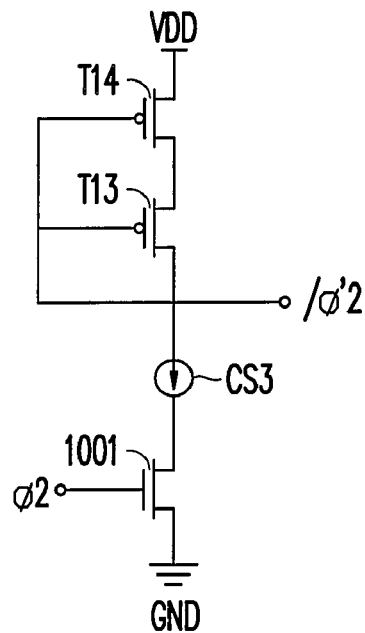
FIG. 10A is a schematic drawing of an implementation of the clock signal attenuator 921 in FIG. 9.

FIG. 9 is a schematic drawing of an embodiment of the rail-to-rail circuit having clock signal attenuators in the high accuracy sample and hold circuit of FIG. 3A according to the present invention. The difference of the embodiment from the above-described one resides in that the embodiment employs clock signal attenuators to attenuate the voltages of the control signals. The clock signal attenuators 921~924 respectively input the attenuated signals to the first input stage 9091 and the second input stage 9092. FIG. 10A is a schematic drawing of an implementation of the clock signal attenuator 921 in FIG. 9. The clock signal attenuator 921 includes a current source CS3, a transistor T13, a transistor T14 and a transistor 1001. Wherein, the transistor 1001 serves as the first switch, the control terminal of the transistor 1001 receives a not-attenuated control signal 2 and one terminal thereof is coupled to the grounding voltage GND. The transistors T13 and T14 are coupled to the voltage VDD and provide a voltage difference for inverting and reducing the output voltage. The current source CS3 provides the transistors 1001, T13 and T14 with driving currents and then the gate of the transistor T13 outputs the inverted control signal / 2'. FIG. 10C is a timing diagram of the control signals 1, 2, / 1, / 2, 1', 2', / 1' and / 2'. From FIGS. 10A and 10C it can be seen that the high level of the control signal 2 is V3 with a larger voltage, which is attenuated by the clock signal attenuator of FIG. 10A and then converted into the inverted control signal / 2' with a high level of less voltage V4. Going back to FIG. 9, where the clock signal attenuator 922 has the same structure as the clock signal attenuator 921, the clock signal attenuator 922 in FIG. 9 receives the control signal 1 and outputs the inverted control signal / 1'. As shown by FIG. 10C, the voltage V4, i.e. the high level of the inverted control signal / 1', is less than the voltage V3 of the high level of the control signal 1.

Figure 10B:
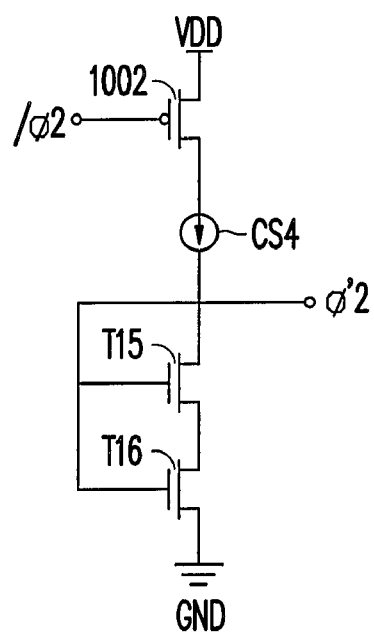
FIG. 10B is a schematic drawing of an implementation of the clock signal attenuator 923 in FIG. 9.
Figure 10C:
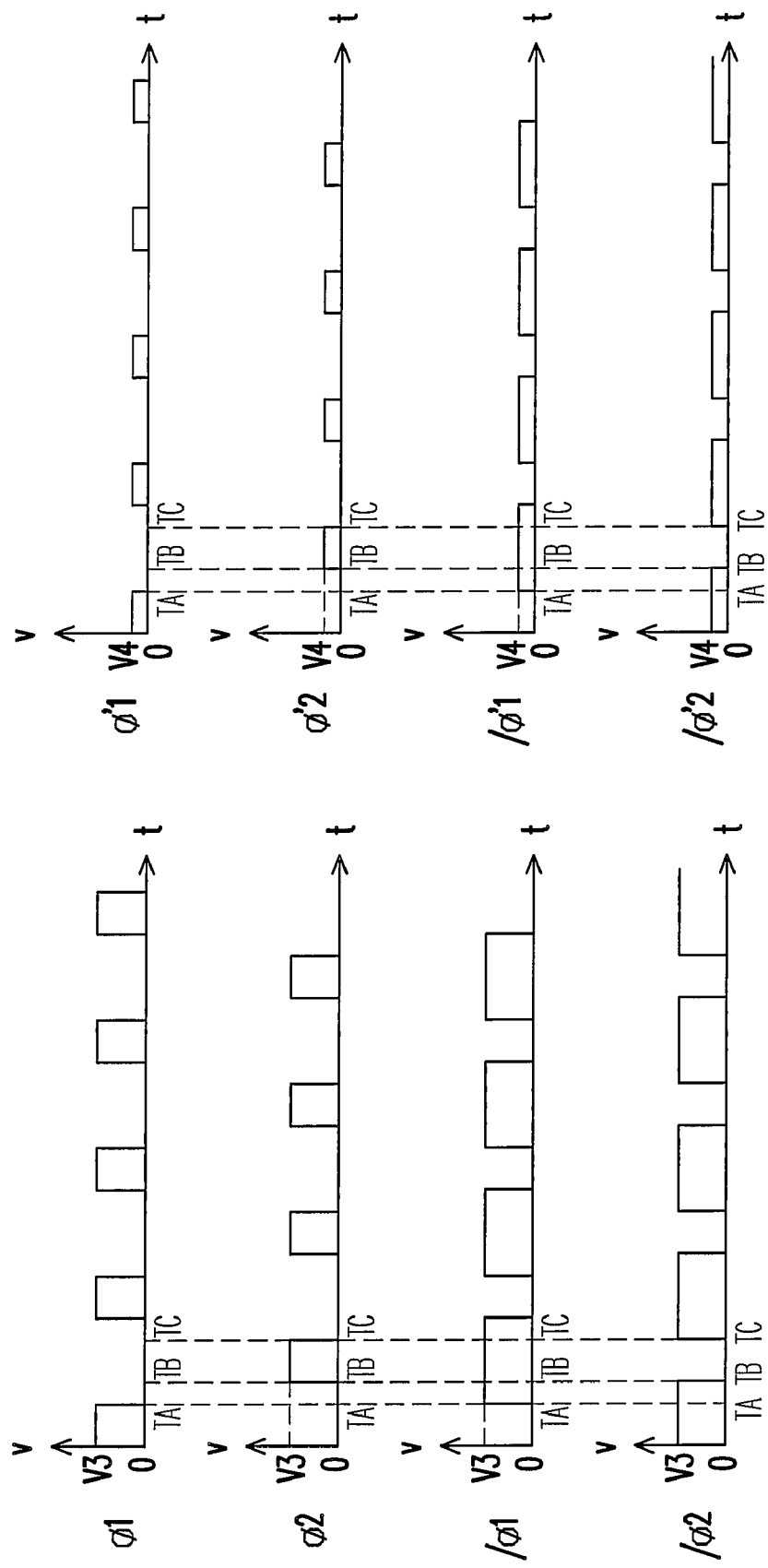
FIG. 10C is a timing diagram of the control signals in FIG. 9.

FIG. 10B is a schematic drawing of an implementation of the clock signal attenuator 923. The clock signal attenuator 923 in FIG. 9 can be implemented by the circuit of FIG. 10B. The clock signal attenuator 923 includes a current source CS4, a transistor T15, a transistor T16 and a transistor 1002. Wherein, the transistor 1002 serves as the first switch, the control terminal of the transistor 1002 receives a not-attenuated inverted control signal / 2 and one terminal thereof is coupled to the voltage VDD. The transistors T15 and T16 are coupled to the grounding voltage GND and provide a voltage difference for inverting and reducing the output voltage. The current source CS4 provides the transistors 1002, T13 and T14 with driving currents and then the gate of the transistor T15 outputs the control signal 2'. The clock signal attenuator 924 in FIG. 9 has the similar structure of FIG. 10B except that the clock signal attenuator 924 receives the inverted control signal / 1 and outputs the control signal 1'. It can be seen from FIG. 10C that the voltage V4, i.e. the high level of the inverted control signals / 1' and / 2', is less than the voltage V3 which is the high level of the control signals 1 and 2.

Referring back to FIG. 9, the switches SW3 and SW4 in FIG. 9 sequentially sample the input voltage Vin according to the control signals φ1 and φ2. Referring to FIGS. 9 and 10C, during the period between 0 and TA, the switch SW3 is a short circuit, the switch SW4 is an open circuit and the voltage of the capacitor C4 is input to the amplifier 9080. At this point, the control signal φ1 and the inverted control signal /φ1 respectively pass the clock signal attenuators 922 and 924 and are input to the transistors 902 and 911, the transistors 902 and 911 are current-on between the sources and the drains thereof and, thus, the transistors 905 and 908 capture the voltage of the capacitor C4. Since the transistors 903 and 909 are respectively connected to the grounding voltage GND and the voltage VDD to keep current-on status between the sources and the drains thereof, hence, transistors 905 and 908 at the positive terminal and transistors 906 and 912 at the negative terminal output the sampled voltages to the output stage 9100, and output the voltage Vout from the output stage 9100. Since the gates of the transistors 906 and 912 are connected to the output part of the output stage, the amplifier 9080 is operated in negative feedback mode to serve as a buffer. Meanwhile, the control signal φ2 and the inverted control signal /φ2 respectively pass the clock signal attenuators 921 and 923 to turn off the transistors 901 and 910 between the sources and the drains thereof, therefore, the transistors 904 and 907 are not able to capture the voltage of the capacitor C3. The current sources CS5 and CS6 respectively provide the input stages 9092 and 9091 with driving currents. During the period between TB and TC, the transistors 904 and 907 capture the voltage of the capacitor C3 and the transistors 904, 907, 906 and 912 together output voltages to the output stage 9100, and then, the output stage 9100 further outputs Vout and gives a negative feedback to the transistors 906~912 to make the amplifier 9080 serves as a buffer. In the circuit of FIG. 9, the transistors 906 and 912 at the negative terminal are directly coupled to the output terminal of the output stage 9100 to achieve a negative feedback function. In fact, a resistor, a capacitor, an inductor, a transistor or other elements may be connected in series or in parallel between the negative terminal and the output terminal to achieve the negative feedback function, which is also construed to be within the scope of the present invention.

The circuit of FIG. 9 can be applied to a display panel for driving, which requires multiple sample and hold circuits (normally hundreds even over a thousand of the circuits). Since the circuit allows sharing a common negative input terminal, the circuit area can be reduced in addition to avoiding the charge redistribution effect on the parasitic capacitors. Although the clock signal attenuators employed by the circuit to reduce the clock feed-through needs to dispose the additional twelve transistors, but the clock signal attenuation apparatuses can be shared by multiple sample and hold circuits, therefore it is not a limitation. The high accuracy sample and hold circuit provided by the present invention not only advances the sample and hold function, but also reduces the size of the circuit and enhance the function of the display panel with an improved display quality.

In summary, since a structure capable of switching the input terminals to avoid the above-described sample and hold capacitors and the parasitic capacitors of the amplifier from a charge redistribution effect to affect the sampling voltage is provided inside the amplifier of the high accuracy sample and hold circuit, the circuit allows to share a common negative input terminal for reducing the circuit elements, the circuit uses the rail-to-rail complementation structure and uses the clock signal attenuation scheme to reduce the noises of the control signals for enhancing the sample and the hold effect. Furthermore, a circuit structure for reducing the clock signal voltages is provided. Therefore, the present invention is capable of performing high accuracy sample and hold operations on the input voltage.

It will be apparent to those skilled in the art that various modifications and variations can be made to the structure of the present invention without departing from the scope or spirit of the invention. In view of the foregoing, it is intended that the specification and examples to be considered as exemplary only, with a true scope and spirit of the invention being indicated by the following claims and their equivalents.

What is claimed is:

1. A high accuracy sample and hold circuit, suitable for sampling an input signal and outputting an output signal; the circuit comprising:

a first switch, comprising a first terminal for receiving the input signal, for connecting the input signal to a second terminal thereof during a first period;

a second switch, comprising a first terminal for receiving the input signal, for connecting the input signal to a second terminal thereof during a second period;

a first capacitor, comprising a first terminal coupled to the second terminal of the first switch, and a second terminal coupled to a first voltage, wherein the first capacitor is used for saving a first sample result of the input signal;

a second capacitor, comprising a first terminal coupled to the second terminal of the second switch, and a second terminal thereof is coupled to a second voltage, wherein the second capacitor is used for saving a second sample result of the input signal; and an amplifier, comprising at least:

a first positive input terminal, coupled to the second terminal of the first switch;

a second positive input terminal, coupled to the second terminal of the second switch;

a negative input terminal, for providing a reference input relative to inputs of the first positive input terminal and the second positive input terminal;

an output terminal, for outputting the output signal;

a first input stage, including a first input circuit coupled to the first positive input terminal, a second input circuit coupled to the second positive input terminal and a third input circuit coupled to the negative input terminal, wherein the first input circuit is disabled and the second input circuit is enabled during the first period, while the first input circuit is enabled and the second input circuit is disabled during the second period;

a second input stage, including a fourth input circuit coupled to the first positive input terminal, a fifth input circuit coupled to the second positive input terminal and a sixth input circuit coupled to the negative input terminal, wherein the fourth input circuit is disabled and the fifth input circuit is enabled during the first period, while the fourth input circuit is enabled and the fifth input circuit is disabled during the second period;

an output stage, for providing the output signal to the output terminal according to outputs of the first input circuit, the second input circuit and the third input circuit;

a first clock signal attenuator, coupled to the first input circuit used for attenuating a second control signal and outputting the attenuated second control signal to the first input circuit, so as to disable the first input circuit during the first period and to enable the first input circuit during the second period and a second clock signal attenuator, coupled to the second input circuit for attenuating a first control signal and outputting the attenuated first control signal to the second input circuit, so as to enable the second input circuit during the first period and to disable the second input circuit during the second period;

a third clock signal attenuator, coupled to the fourth input circuit and used for attenuating a fourth control signal and outputting the attenuated fourth control signal to the fourth input circuit, so as to disable the fourth input circuit during the first period and to enable the fourth input circuit during the second period; and a fourth clock signal attenuator, coupled to the fifth input circuit and used for attenuating a third control signal and outputting the attenuated third control signal to the fifth input circuit, so as to enable the fifth input circuit during the first period and to disable the fifth input circuit during the second period.

2. The high accuracy sample and hold circuit as recited in claim 1, wherein the negative input terminal of the amplifier is coupled to the output terminal of the amplifier.

3. The high accuracy sample and hold circuit as recited in claim 1, wherein each of the first voltage and the second voltage comprises a grounding voltage or a reference voltage, wherein the reference voltage comprises a fixed voltage level or a variable voltage level.

4. The high accuracy sample and hold circuit as recited in claim 1, wherein the first input stage further comprises:

a current source, coupled to the first input circuit, the second input circuit and the third input circuit.

5. The high accuracy sample and hold circuit as recited in claim 4, wherein the first input circuit comprises:

a first transistor, comprising a gate coupled to the first positive input terminal, and a first terminal providing an output of the first input circuit; and a third switch, comprising a first terminal coupled to a second terminal of the first transistor, and a second terminal coupled to the current source, wherein the third switch is turned on during the second period;

the second input circuit comprises:

a second transistor, comprising a gate coupled to the second positive input terminal, and a first terminal providing an output of the second input circuit; and a fourth switch, comprising a first terminal coupled to the second terminal of the second transistor, a second terminal coupled to the current source, wherein the fourth switch is turned on during the first period; and the third input circuit comprises a third transistor, comprising a gate coupled to the negative input terminal, and a first terminal providing an output of the third input circuit.

6. The high accuracy sample and hold circuit as recited in claim 5, wherein the third input circuit further comprises a fifth switch, comprising a control terminal coupled to a third voltage, wherein a first terminal is coupled to the second terminal of the third transistor and a second terminal of the fifth switch is coupled to the current source.

7. The high accuracy sample and hold circuit as recited in claim 4, wherein the first input circuit comprises:

a third switch, comprising a first terminal and a second terminal, being turned on during the second period, wherein the first terminal provides an output of the first input circuit; and a first transistor, comprising a gate coupled to the first positive input terminal, a first terminal coupled to the second terminal of the third switch, and a second terminal coupled to the current source;

the second input circuit comprises:
a fourth switch, comprising a first terminal and a second terminal, being turned on during the first period, wherein the first terminal provides an output of the second input circuit; and
a second transistor, comprising a gate coupled to the second positive input terminal, a first terminal coupled to the second terminal of the fourth switch and a second terminal coupled to the current source; and
the third input circuit comprises a third transistor having a gate coupled to the negative input terminal, and a second terminal coupled to the current source.

8. The high accuracy sample and hold circuit as recited in claim 7, wherein the third input circuit further comprises a fifth switch, wherein a control terminal thereof is coupled to a third voltage, a first terminal thereof provides an output of the third input circuit and a second terminal thereof is coupled to the first terminal of the third transistor.

9. The high accuracy sample and hold circuit as recited in claim 1, wherein the first switch is controlled by the first control signal and connects the input signal from the first terminal to the second terminal thereof during the first period and is turned off during the second period; and wherein the second switch is controlled by the second control signal, connects the input signal from the first terminal to the second terminal thereof during the second period and is turned off during the first period.

10. The high accuracy sample and hold circuit as recited in claim 1, wherein the first clock signal attenuator comprises:
a third switch, comprising a control terminal for receiving the second control signal and a first terminal coupled to a third voltage;
a current source, comprising a first terminal coupled to the second terminal of the third switch, wherein a second terminal of the current source provides the attenuated second control signal;
a first transistor, comprising a gate and a first terminal coupled to the second terminal of the current source; and
a second transistor, comprising a gate coupled to the second terminal of the current source, a first terminal coupled to the second terminal of the first transistor and a second terminal coupled to a fourth voltage.

11. The high accuracy sample and hold circuit as recited in claim 1, wherein the second input stage further comprises:
a current source, coupled to the fourth input circuit, the fifth input circuit and the sixth input circuit.

12. The high accuracy sample and hold circuit as recited in claim 11, wherein the fourth input circuit comprises:
a fourth transistor, comprising a gate coupled to the first positive input terminal and a first terminal for providing an output of the fourth input circuit; and
a sixth switch, comprising a first terminal coupled to a second terminal of the fourth transistor, a second terminal coupled to the current source, and the sixth switch is turned on during the second period;
the fifth input circuit comprises:
a fifth transistor, comprising a gate coupled to the second positive input terminal and a first terminal for providing an output of the fifth input circuit; and
a seventh switch, comprising a first terminal coupled to a second terminal of the fifth transistor, a second terminal coupled to the current source, wherein the seventh switch is turned on during the first period; and
the sixth input circuit comprises a sixth transistor, wherein a gate thereof is coupled to the negative input terminal, while a first terminal thereof provides an output of the sixth input circuit.

13. The high accuracy sample and hold circuit as recited in claim 12, wherein the sixth input circuit further comprises an eighth switch, wherein a control terminal thereof is coupled to a fourth voltage, a first terminal thereof is coupled to the second terminal of the sixth transistor and the second terminal of the eighth switch is coupled to the current source.

14. The high accuracy sample and hold circuit as recited in claim 11, wherein the fourth input circuit comprises:
a sixth switch, comprising a first terminal and a second terminal, being turned on during the second period, wherein the first terminal provides an output of the fourth input circuit; and
a fourth transistor, comprising a gate coupled to the first positive input terminal, a first terminal coupled to the second terminal of the sixth switch and a second terminal coupled to the current source;
the fifth input circuit comprises:
a seventh switch, comprising a first terminal and a second terminal, being turned on during the first period, wherein the first terminal is adopted for providing an output of the fifth input circuit; and
an fifth transistor, comprising a gate coupled to the second positive input terminal, a first terminal coupled to the second terminal of the seventh switch and a second terminal coupled to the current source; and
the sixth input circuit comprises a sixth transistor comprising a gate coupled to the negative input terminal and a second terminal coupled to the current source.

15. The high accuracy sample and hold circuit as recited in claim 14, wherein the sixth input circuit further comprises an eighth switch comprising a control terminal coupled to a third voltage, a first terminal for providing an output of the sixth input circuit and a second terminal coupled to the first terminal of the sixth transistor.

16. The high accuracy sample and hold circuit as recited in claim 1, wherein the third clock signal attenuator comprises: a third switch, comprising a control terminal for receiving the second control signal and a first terminal coupled to a third voltage; a current source, comprising a first terminal coupled to the second terminal of the third switch and a second terminal for providing the attenuated second control signal; a first transistor, comprising a gate and a first terminal coupled to the second terminal of the current source; and a second transistor, comprising a gate coupled to the second terminal of the current source, a first terminal coupled to the second terminal of the first transistor and a second terminal coupled to a fourth voltage.

17. The high accuracy sample and hold circuit as recited in claim 1, wherein the first capacitor comprises a parasitic capacitor.

18. The high accuracy sample and hold circuit as recited in claim 1, wherein the second capacitor comprises a parasitic capacitor.

* * * * *